Oct. 10, 1961 R. EMEIS 3,004,168

ENCAPSULED PHOTOELECTRIC SEMICONDUCTOR DEVICE AND METHOD OF ITS MANUFACTURE

Filed Feb. 20, 1959

United States Patent Office 3,004,168

Patented Oct. 10, 1961

3,004,168

ENCAPSULED PHOTOELECTRIC SEMICONDUCTOR DEVICE AND METHOD OF ITS MANUFACTURE

Reimer Emeis, Ebermannstadt, Upper Franconia, Germany, assignor to Siemens-Schuckertwerke Aktiengesellschaft, Berlin-Siemensstadt, Germany, a corporation of Germany Filed Feb. 20, 1959, Ser. No. 794,735

Claims priority, application Germany Feb. 22, 1958

11 Claims. (Cl. 250—211)

Figure 1:
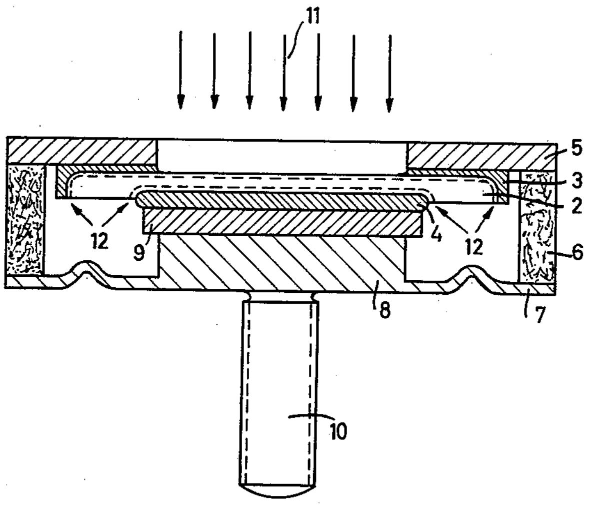

My invention relates to photoelectric cells, phototransistors and related photoelectric semiconductor devices of the junction type.

Such devices comprise a preferably monocrystalline semiconductor body which may consist of germanium or silicon, or of indium arsenide, indium antimonide, gallium phosphide or other semiconducting binary compounds of respective elements from the third and fifth B-groups of the periodic system. The semiconductor crystal is doped with lattice defection atoms acting as acceptors or donors to provide one or more p-n junctions, and is joined with electrodes suitable for the particular use intended. As a rule, the crystal with its electrodes is enclosed in a gas-tight housing to prevent atmospheric effects from impairing the p-n junctions, particularly at those localities where these junctions reach the surface of the crystal. The obscuring effect of such enclosure, however, is apt to impair the photoelectric sensitivity of the device.

It is an object of my invention to provide an encapsuled photoelectric semiconductor device in which all damage-susceptible localities of the semiconductor crystal are protected within the capsule yet the photo-responsive areas of the crystal remain freely exposed to ingress of light or other electromagnetic radiation.

According to my invention, I encapsule the crystal and electrodes of a photoelectric semiconductor device in a gas-tight housing or capsule in such a manner that the photoelectrically active semiconductor surface forms a portion of the exterior surface of the housing.

According to another feature of my invention, the photoelectric semiconductor device is produced by joining the electrodes with the disc-shaped crystal by alloying suitable electrode metals or metal alloys, preferably in form of foils, together with, and into, respective surface zones of the crystal body; and the photoelectrically active semiconductor surface is obtained by thus alloying a metal foil into a flat side of the disc-shaped crystal and thereafter etching a portion of the foil away, down to the recrystallization layer, while preserving a marginal portion of the metal foil. This results in an annular electrode which surrounds the photoelectrically active semiconductor surface. This surface is thereafter made to form part of the exterior surface of a capsule by joining the annular electrode with a sealed housing that has an opening in front of the photoelectrically active crystal surface.

Encapsuled devices according to the invention excel the known photoelectric semiconductor devices by increased photoelectric sensitivity, better stability and prolonged useful life. These advantages are due to the fact that the active semiconductor surface is located at the outside of the gas-tight enclosure and yet the endangered localities are situated within the sealed housing. These localities are particularly those at which the boundary area between the recrystallization layer and the interior of the semiconductor crystal that remained unaffected by the doping and recrystallization process, emerges at the outside of the crystal.

Figure 2:
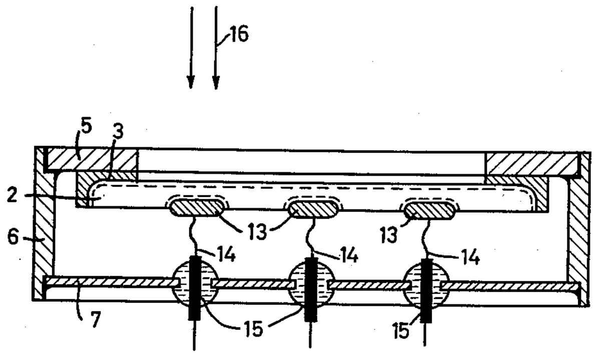

The above-mentioned and other advantages and features of my invention will be apparent from, and will be more fully explained in the following, with reference to the embodiments of photoelectric semiconductor devices according to the invention illustrated by way of example on the accompanying drawings, in which FIG. 1 is a cross section of a phototransistor with a single pair of electrodes, and FIG. 2 is a cross section of another phototransistor in which a subdivided counter-electrode is located on the side of the semiconductor crystal opposite its photoelectrically active surface.

The phototransistor shown in FIG. 1 comprises a circular disc 2 of semiconductor material, for example p-type silicon, into which metal foils are alloyed on both flat sides of the disc. The metal foils thus fusion-bonded with the semiconductor crystal may consist of a gold-antimony alloy, such as an alloy of about 99% gold and about 1% antimony. During the alloying operation, the gold-antimony alloy penetrates into the silicon and, during the subsequent cooling and solidifying, recedes back toward the surface, leaving some of the antimony dissolved in the silicon while some silicon penetrates into the gold-antimony. This results in the formation of a diffusion layer at the crystal surface which consists of a eutectic alloy of gold-antimony-silicon, with a highly antimony-doped, n-conducting recrystallization layer located between the surface layer and the interior of the silicon that remained unaffected by the alloying process. The boundary area between the n-type recrystallization layer and the interior bulk of the silicon crystal forms a p-n junction which is schematically indicated in FIG. 1 by a broken line.

Now, according to the invention, a portion of the upper metal foil, which has been alloyed together with the silicon crystal, is subsequently etched away down to the recrystallization layer so that the doped semiconductor layer is exposed to the outside. Only a ring shaped portion of the original metal foil remains preserved as an electrode 3. Another way of obtaining the same result according to the invention is to etch the entire gold-silicon-antimony layer away down to the recrystallization layer, and subsequently mounting a ring-shaped metal part as an electrode upon the silicon crystal.

In comparison with the known method of producing photo-semiconductor devices by diffusing foreign atoms into the semiconductor crystal, the method according to the invention has the considerable advantage of using greatly reduced temperatures for locally reversing the type of conductance by doping. Thus, the temperature used in the above-described method, applied to silicon, is approximately 500 to 700° C. as compared with 1200 to 1300° C. required in the known diffusion method. As a result, the inevitable reduction in the life-time of the minority charge carriers resulting from any heat treatment, is extremely much smaller, namely one or more decimal orders of magnitude smaller, than with the known high-temperature diffusion method. Further advantages result from the elimination of a processing step because, when operating with the known diffusion method, it is first necessary to join the semiconductor crystal with an electrode suitable for contacting, which may result in further impairment of the semiconductor properties.

Reverting to FIG. 1, the electrode 4 opposite the photoelectrically active semiconductor surface is kept smaller from the start. A flat ring 5 of tungsten or molybdenum is then placed upon the upper ring-shaped electrode 3. An electric terminal (not shown) can be joined to ring 5. The outer diameter or ring 5 is larger than the diameter of the semiconductor disc 2 and the electrode 3. It is preferable to coat the under surface of the tungsten or molybdenum ring 5 with the metal of the electrode 3 prior to assembling the ring 5 together with the other components. The coating is effected, for example, by electroplating, or by first galvanizing the ring, and thereafter heating or firing the coating. This is done before the ring 5 and the electrode 3 are joined with each other by soldering or alloying. Thereafter a cylindrical housing member 6 and a cover 7 are applied, to close and seal the housing on all sides. The cylindrical housing portion 6 is preferably made of ceramic material, and the cover 7 of metal such as copper. The housing portion 6 can be metallized at the proper places and can then be joined with the metal ring 5 and the metal cover 7 by soldering at the metallized places. It is advantageous to design the middle portion 8 of the metal cover 7 as a cooling block and to join it by an electrically conducting and good heat conducting connection with the electrode 4 located on the semiconductor body opposite the active semiconductor surface. The metal cover 7 is preferably made resilient, and for this purpose is given a wavy or crimped cross section as illustrated. This serves to equalize mechanical tensions. A disc 9 of tungsten or molybdenum is disposed between the electrode 4 and the middle portion 8 of the metal cover 7. Before assembling and joining the disc 9 with the electrode 4, it is preferably coated with an alloy corresponding to that of the electrode 4. The diameter of the disc 9 is larger than the diameter of the exposed photoelectrically active semiconductor surface of disc 2 or the inner diameter of the ring 5. As a result, the metal parts 5 and 9 can serve as a support for the semiconductor disc 2, which is relatively sensitive mechanically. A screw bolt 10, which may be integral with the metal cover 7 and the cooling block 8, serves to conduct electric current and, if desired, to fasten the device on another holder suitable for dissipation of heat. The ceramic housing portion 6 insulates the electrode 5 from the current conducting bolt 10.

The arrows 11 shown in FIG. 1 signify the incidence of light which causes electric conductance changes in the active semiconductor surface.

The outstanding advantage of the above-described photo-semiconductor device is the fact that the particularly sensitive places at which the boundary areas between the unchanged interior of the semiconductor and the recrystallization layer emerges at the outside of the semiconductor body, these localities being indicated in FIG. 1 by arrows 12, are enclosed within the housing, whereas the active semiconductor surface is freely exposed to the light or radiation to be responded to. This is of considerable advantage for photo-diodes, phototransistors, solar batteries and the like photoelectric semiconductor devices.

The photosemiconductor device according to FIG. 2 is provided with an electrode subdivided into three parts, the reference characters in FIG. 2 being identical with those shown in FIG. 1 relative to functionally corresponding elements respectively. In contrast to FIG. 1, however, the electrode on the silicon disc 2 opposite the active semiconductor surface is subdivided into three parts 13, which may have circular or any other desired shape. Each electrode is connected with a current supply lead 15 which passes through the cover 7 of the housing in insulated and sealed relation thereto. The lead-in seals 15 may consist of glass. In this case the cylindrical housing portion 6 need not consist of insulating material but may be made of metal.

It will be understood that any larger number of individual electrodes 13 may be provided. Such subdivision of the electrode facilitates a control operation in dependence upon positional changes of a beam or ray of light 16. That is, if the respective electrodes 13 are connected to different circuits, then these circuits can be selectively controlled with the aid of a traveling stream or ray of light. Since the method according to the invention permits the production of photosemiconductor degrees of relatively large active areas, the invention affords the possibility of providing a relatively great number of partial electrodes thus permitting the application of a variety of electric control connections.

The alloying of the gold foils can be carried out by heating under application of mechanical pressure, and while embedded in a powder, as described in the copending application of the applicant, Serial No. 637,029, filed January 29, 1957.

If the photosemiconductor device according to the invention is based upon a crystal of p-type germanium the metal foils to be alloyed into the crystal may consist of a gold-antimony alloy too. If the base body of the element consist of n-type material the metal foils may consist of gallium or indium, thus forming a p-n-p transistor by alloying the foils into the semiconductor body. The other steps of the method of making a photoelectric semiconductor device according to the invention may be the same as in the example broader described.

I claim:

1. A photoelectric semiconductor device, comprising a monocrystalline semiconductor body provided with a p-n junction that reaches a surface region of the crystal, a gas-tight housing comprising an annular metallic electrode plate disposed adjacent, and in sealed relation with respect to a second surface region of the crystal, the annular electrode exposing, within its inner periphery, a photo-sensing surface area of the crystal, said housing further comprising a second electrode disposed on a third surface region of the crystal, and means connecting the two electrodes to complete said housing, said means including a member that electro-insulates the said two electrodes from each other, the two electrodes being electro-conductively connected to each other through the said body.

2. A photoelectric semiconductor device, comprising a monocrystalline semiconductor body provided with a p-n junction that extends in a direction toward a first surface region of the crystal, an annular metallic layer alloyed with a second surface region of the crystal, an annular metallic electrode in sealing connection with respect to the annular layer, the periphery of the annular electrode extending outwardly of the periphery of the annular layer, the annular layer and the annular electrode exposing, within their inner peripheries, a photo-sensing surface area of the crystal, a second electrode on a third surface region of the crystal, and means connecting the annular electrode and the second electrode to form a gas-tight housing, said means including a member that electro-insulates the annular and the second electrodes from each other, the housing enclosing the first surface region, the two electrodes being electro-conductively connected to each other through said body.

3. A photoelectric semiconductor device, comprising a monocrystalline semiconductor p-type silicon body provided with a p-n junction that extends in a direction toward a first surface region of the crystal, an annular gold-antimony layer alloyed with a second surface region of the crystal, an annular metallic electrode in sealing connection with respect to the annular layer, the periphery of the annular electrode extending outwardly of the periphery of the annular layer, the annular layer and the annular electrode exposing, within their inner peripheries, a photo-sensing surface area of the crystal, a second electrode, of gold-antimony, on a third surface region of the crystal, and means operatively connecting the annular electrode and the second electrode to form a gas-tight housing, said means including a member that electro-insulates the annular and the second electrodes from each other, the housing enclosing the first surface region, the two electrodes being electro-conductively connected to each other through said body.

4. The apparatus defined in claim 2, the annular electrode being formed of a metal taken from the group consisting of tungsten and molybdenum.

5. The apparatus defined in claim 2, said member comprising circumferentially enclosing ceramic means.

6. A photoelectric semiconductor device, comprising a monocrystalline semiconductor body provided with a p-n junction that extends in a direction toward a first surface region of the crystal, an annular metallic layer alloyed with a second surface region of the crystal, an annular metallic electrode in sealing connection with respect to the annular layer, the periphery of the annular electrode extending outwardly of the periphery of the annular layer, the annular layer and the annular electrode exposing, within their inner peripheries, a photo-sensing surface area of the crystal, a second electrode on a third surface region of the crystal, and means connecting the annular electrode and the second electrode to form a gas-tight housing, said means including a member that electro-insulates the annular and the second electrodes from each other, the housing enclosing the first surface region, the two electrodes being electro-conductively connected to each other through said body, said member comprising circumferentially enclosing ceramic means, the second electrode being formed of a metal taken from the group consisting of tungsten and molybdenum, said ceramic member being joined to the second electrode by soldering, the ceramic member having a metallized portion at the soldering location.

7. A photoelectric semiconductor device, comprising a monocrystalline semiconductor body provided with a p-n junction that extends in a direction toward a first surface region of the crystal, an annular metallic layer alloyed with a second surface region of the crystal, an annular metallic electrode in sealing connection with respect to the annular layer, the periphery of the annular electrode extending outwardly of the periphery of the annular layer, the annular layer and the annular electrode exposing, within their inner peripheries, a photo-sensing surface area of the crystal, a second electrode on a third surface region of the crystal, annular, rigid, electro-insulative, circumferentially extending means, a metallic means, capable of flexure, supporting the semiconductor body on a surface region thereof opposite the photo-sensing surface area, said electro-insulative means and said metallic means comprising a housing enclosing the first surface region.

8. A photoelectric semiconductor device, comprising a monocrystalline semiconductor body provided with a p-n junction that extends in a direction toward a first surface region of the crystal, an annular metallic layer alloyed with a second surface region of the crystal, an annular metallic electrode in sealing connection with respect to the annular layer, the periphery of the annular electrode extending outwardly of the periphery of the annular layer, the annular layer and the annular electrode exposing, within their inner peripheries, a photo-sensing surface area of the crystal, a second electrode on a third surface region of the crystal, annular, rigid, electro-insulative, circumferentially extending means, a metallic means, capable of flexure, supporting the semiconductor body on a surface region thereof opposite the photo-sensing surface area, said electro-insulative means and said metallic means comprising a housing enclosing the first surface region, said metallic means providing a flexible plate and a cooling block, the block being in supportive and in electro- and heat-conducting relation with at least the central portion of the second electrode.

9. A photoelectric semiconductor device, comprising a monocrystalline, silicon semiconductor body provided with a p-n junction that extends in a direction toward a first surface region of the crystal, an annular gold layer alloyed with a second surface region of the crystal, an annular metallic electrode in operative sealing connection with respect to the annular layer, the periphery of the said annular electrode extending outwardly of the periphery of the annular layer, the annular layer and the annular electrode exposing, within their inner peripheries, a photo-sensing surface area of the crystal, a second electrode, of gold, alloyed with a third surface region of the crystal, and means operatively connecting the annular electrode and the second electrode to form a gas-tight housing, the housing enclosing the first surface region, said means including an annular housing member that electro-insulates the second electrode from the annular layer and annular electrode, the housing further comprising a metallic, flexible cover plate for the annular housing member, and a plate of metal taken from the group consisting of molybdenum and tungsten between the second electrode and the cover plate.

10. A photoelectric semiconductor device, comprising a semiconductor body and electrodes on said body, said device having a gas-tight housing, the body having a photo-electrically active semiconductor surface forming a portion of the exterior surface of the gas-tight housing, the body having two opposite faces and a peripheral surface, one of said electrodes being in electro-conductive connection only with that one of the two opposite faces of the body which provides said photoelectrically active surface, a plurality of other electrodes in electro-conductive connection only with the second of the opposite faces, and separate current supply leads connected to said other electrodes, the leads being passed through the housing in electro-insulative and sealing connection therewith.

11. A photoelectric semiconductor device, comprising a monocrystalline semiconductor body provided with a p-n junction that extends at least toward a first surface region of the crystal, an annular metallic electrode foil alloyed with a second surface region of the crystal, the annular electrode exposing, within its inner periphery, a photo-sensing surface area of the crystal, a second electrode foil alloyed with a third surface region of the crystal, on a face thereof opposite the face on which the second surface region is located, and means for joining the two electrodes to provide a gas-tight housing to enclose said first surface region, said means comprising a member that electro-insulates the two electrodes from each other, the two electrodes being electroconductively connected to each other through said body.

References Cited in the file of this patent

UNITED STATES PATENTS

| | | |
|---|---|---|
| 2,749,488 | Mayer | June 5, 1956 |
| 2,805,347 | Haynes et al. | Sept. 3, 1957 |
| 2,831,981 | Watts | Apr. 22, 1958 |
| 2,887,415 | Stevenson | May 19, 1959 |
| 2,898,474 | Rutz | Aug. 4, 1959 |
| 2,900,287 | Bestler | Aug. 18, 1959 |